US012376384B2

(12) United States Patent
Tanaka

(10) Patent No.: US 12,376,384 B2
(45) Date of Patent: Jul. 29, 2025

(54) SEMICONDUCTOR INTEGRATED CIRCUIT DEVICE

(71) Applicant: Socionext Inc., Kanagawa (JP)

(72) Inventor: Hidetoshi Tanaka, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 190 days.

(21) Appl. No.: 18/477,145

(22) Filed: Sep. 28, 2023

(65) Prior Publication Data

US 2024/0038757 A1    Feb. 1, 2024

Related U.S. Application Data

(63) Continuation of application No. PCT/JP2022/012403, filed on Mar. 17, 2022.

(30) Foreign Application Priority Data

Apr. 8, 2021  (JP) .................................. 2021-065885

(51) Int. Cl.
   *H10D 89/60*       (2025.01)
   *H01L 23/522*      (2006.01)

(52) U.S. Cl.
   CPC .......... *H10D 89/60* (2025.01); *H01L 23/5228* (2013.01)

(58) Field of Classification Search
   CPC ... H01L 27/02; H01L 23/522; H01L 27/0248; H01L 23/5228; H01L 27/06; H01L 23/52; H10D 89/60; H10D 89/611; H10D 89/911
   USPC ......................................................... 361/56
   See application file for complete search history.

(56) References Cited

U.S. PATENT DOCUMENTS

| 5,923,079 A | 7/1999 | Narita |
| 2007/0120258 A1 | 5/2007 | Hayashi et al. |
| 2008/0169486 A1* | 7/2008 | Toyoshima ............. H01L 24/06 |
| | | 257/203 |
| 2009/0050940 A1 | 2/2009 | Hayashi et al. |
| 2010/0155845 A1 | 6/2010 | Toba et al. |
| 2010/0171177 A1 | 7/2010 | Hayashi et al. |

(Continued)

FOREIGN PATENT DOCUMENTS

| JP | H10-163433 A | 6/1998 |
| JP | 2007-150150 A | 6/2007 |

(Continued)

OTHER PUBLICATIONS

International Search Report (ISR) dated Jun. 7, 2022 issued in International Patent Application No. PCT/JP2022/012403, with English translation.

*Primary Examiner* — Danny Nguyen
(74) *Attorney, Agent, or Firm* — Rimon P.C.

(57) ABSTRACT

In a semiconductor integrated circuit device, first and second interconnects extending in the X direction are formed in a metal interconnect layer. The first and second interconnects are placed on the opposite sides of each resistor element in the X direction and connected to the resistor element. The first interconnect is connected to PAD, and a third interconnect is connected to VSS. In an ESD protection diode, an anode and a cathode are formed alternately in the Y direction. The resistor element and the first and second interconnects overlap the cathode of the ESD protection diode, and the third interconnect overlaps the anode of the ESD protection diode, in planar view.

5 Claims, 14 Drawing Sheets

(56) References Cited

U.S. PATENT DOCUMENTS

| | | |
|---|---|---|
| 2013/0264647 A1 | 10/2013 | Toba et al. |
| 2013/0341728 A1 | 12/2013 | Hayashi et al. |
| 2015/0108579 A1 | 4/2015 | Hayashi et al. |
| 2015/0287724 A1 | 10/2015 | Hayashi et al. |
| 2016/0094027 A1 | 3/2016 | Arakawa et al. |
| 2016/0233154 A1 | 8/2016 | Hayashi et al. |
| 2018/0197850 A1 | 7/2018 | Toba et al. |
| 2018/0205225 A1 | 7/2018 | Arakawa et al. |
| 2019/0304905 A1 | 10/2019 | Wee et al. |
| 2020/0203334 A1 | 6/2020 | Ito et al. |
| 2020/0381416 A1 | 12/2020 | Tanaka |

FOREIGN PATENT DOCUMENTS

| | | |
|---|---|---|
| JP | 2010-147282 A | 7/2010 |
| JP | 2016-072349 A | 5/2016 |
| JP | 2020-178061 A | 10/2020 |
| WO | 2019/043888 A1 | 3/2019 |
| WO | 2019/163102 A1 | 8/2019 |

* cited by examiner

FIG.8
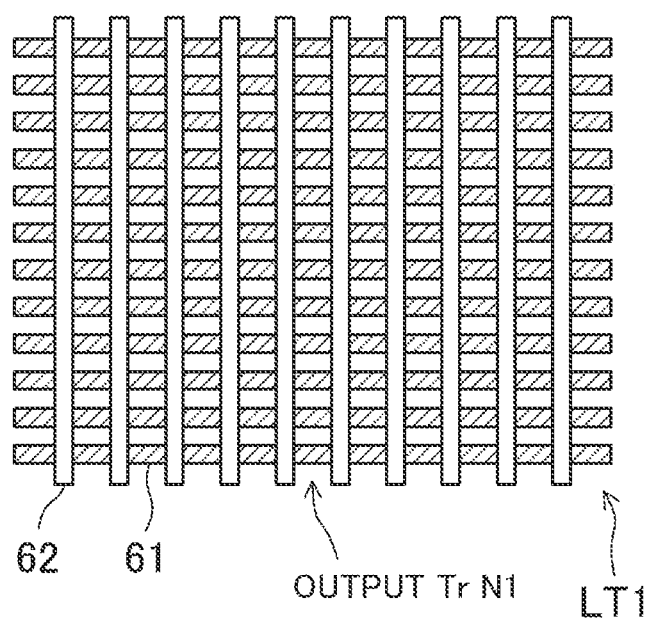
62  61   OUTPUT Tr N1   LT1
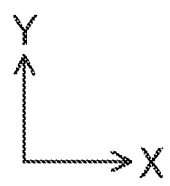
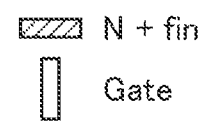

SEMICONDUCTOR INTEGRATED CIRCUIT DEVICE

CROSS-REFERENCE TO RELATED APPLICATIONS

This is a continuation of International Application No. PCT/JP2022/012403 filed on Mar. 17, 2022, which claims priority to Japanese Patent Application No. 2021-065885 filed on Apr. 8, 2021. The entire disclosures of these applications are incorporated by reference herein.

BACKGROUND

The present disclosure relates to a semiconductor integrated circuit device having a core region and an IO region placed on a chip, and more particularly to a layout structure of IO cells arranged in the IO region.

In a semiconductor integrated circuit, input/output (IO) cells are arranged around the core region, and input/output of signals from/to the outside of the semiconductor integrated circuit device, as well as supply of power, are performed through the IO cells.

In the recent miniaturization processes, it is a widespread practice to constitute the gate of a transistor by a high-k gate insulating film and a metal gate. This makes it difficult to use a non-silicided polysilicon resistance formed in the front end of line (FEOL: substrate process) as a resistor element. Presently, a resistor element made of a metal compound, such as titanium nitride, formed between metal interconnect layers in the back end of line (BEOL: interconnect process) has come into use.

United States Patent Publication No. 2019/0304905 discloses a semiconductor integrated circuit device in which a resistor element formed between metal interconnect layers in the BEOL is placed above a diode element as an electrostatic discharge (ESD) protection element, for example.

In the miniaturization processes, the ESD tolerance of a semiconductor integrated circuit is low. In designing the circuit, therefore, it is necessary to examine the interconnect structure in detail for improving the ESD tolerance as much as possible. However, no such examination has been made in the cited document.

An objective of the present disclosure is providing a configuration for improving the ESD tolerance in a semiconductor integrated circuit device using resistor elements formed in the BEOL.

SUMMARY

According to one mode of the present disclosure, a semiconductor integrated circuit device including an output circuit, the output circuit includes: an external output terminal; a first electrostatic discharge (ESD) protection diode connected to the external output terminal at its first node and to a first power supply at its second node; a first protective resistance constituted by a plurality of resistor elements formed in a first interconnect layer, the first interconnect layer being formed in an interconnect process (back end of line (BEOL)), one of the ends of the first protective resistance being connected to the external output terminal; and a first output transistor connected between the other end of the first protective resistance and the first power supply, wherein first, second, and third interconnects extending in a first direction are formed in a second interconnect layer, the first and second interconnects are placed on opposite sides of each of the resistor elements in the first direction in planar view and connected to the resistor element, the first interconnect is connected to the external output terminal, and the third interconnect is connected to the first power supply, in the first ESD protection diode, the first and second nodes are formed alternately in a second direction perpendicular to the first direction, and the resistor elements and the first and second interconnects overlap the first node of the first ESD protection diode, and the third interconnect overlaps the second node of the first ESD protection diode, in planar view.

According to the above mode, the output circuit includes: an external output terminal; a first ESD protection diode connected to the external output terminal at its first node and to a first power supply at its second node; a first protective resistance connected to the external output terminal at one of its ends; and a first output transistor connected between the other end of the first protective resistance and the first power supply. The first protective resistance is constituted by a plurality of resistor elements formed in a first interconnect layer that is formed in the interconnect process (BEOL). In a second interconnect layer, first and second interconnects are placed on the opposite sides of each of the resistor elements in the first direction in planar view and connected to the resistor element. The first interconnect is connected to the external output terminal, and a third interconnect is connected to the first power supply. In the first ESD protection diode, the first and second nodes are formed alternately in a second direction perpendicular to the first direction. The resistor elements and the first and second interconnects overlap the first node of the first ESD protection diode, and the third interconnect overlaps the second node of the first ESD protection diode, in planar view. That is, since the second node of the first ESD protection diode that is to be connected to the first power supply overlaps the third interconnect connected to the first power supply, the resistance in the route from the first power supply to the first ESD protection diode can be reduced. This permits effective operation of the first ESD protection diode, whereby the ESD tolerance can be improved.

According to the present disclosure, in a semiconductor integrated circuit device using resistor elements formed in the BEOL, the ESD tolerance can be further improved.

BRIEF DESCRIPTION OF THE DRAWINGS

FIG. 8 is a plan view showing a layout of an output transistor.

DETAILED DESCRIPTION

Embodiments of the present disclosure will be described hereinafter with reference to the accompanying drawings. In the following description, it is assumed that "VDD" and "VSS" indicate power supply voltages or power supplies themselves. It is also assumed that transistors are formed on a P-substrate and an N-well. Note however that transistors may be formed on a P-well and an N-substrate.

First Embodiment

Figure 1:
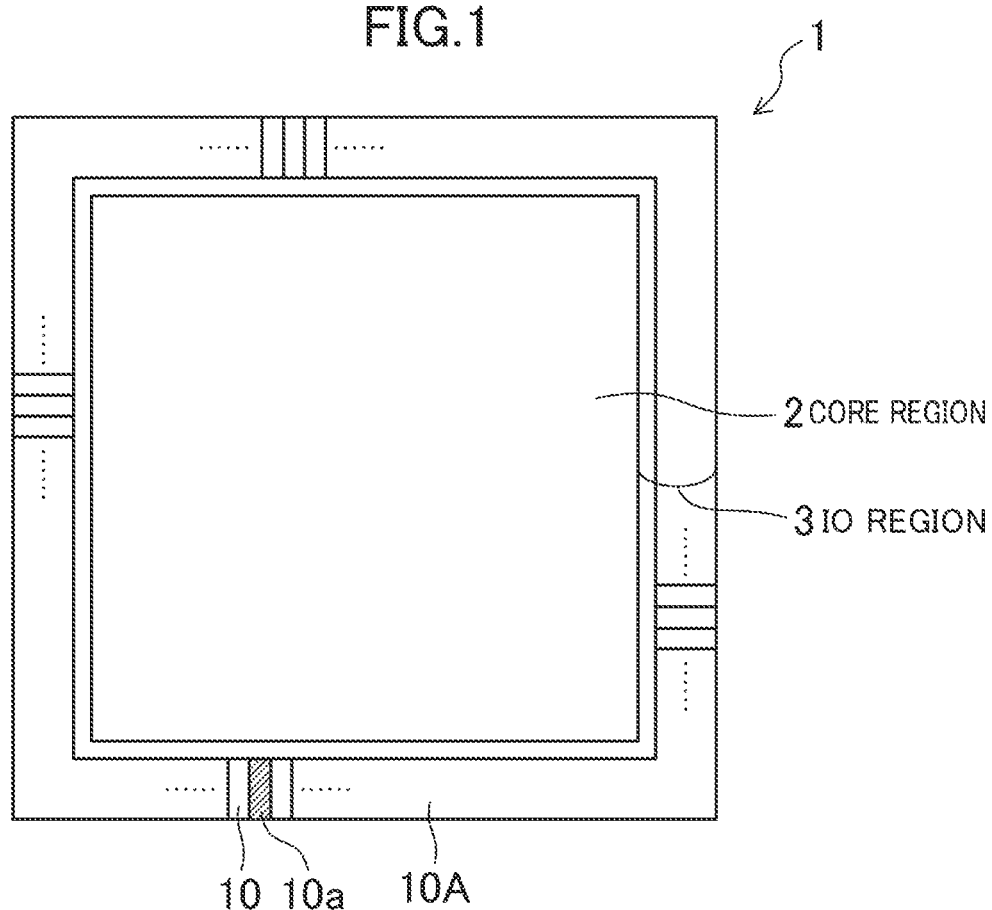
FIG. 1 is a plan view schematically showing the entire configuration of a semiconductor integrated circuit device according to an embodiment.

FIG. 1 is a plan view schematically showing the entire configuration of a semiconductor integrated circuit device according to an embodiment. A semiconductor integrated circuit device 1 shown in FIG. 1 includes: a core region 2 in which internal core circuits are formed; and an IO region 3 provided between the core region 2 and the chip edges, in which interface circuits (IO circuits) are formed. An IO cell row 10A is provided in the IO region 3 to encircle the peripheral portion of the semiconductor integrated circuit device 1. Although illustration is simplified in FIG. 1, a plurality of IO cells 10 constituting interface circuits are arranged in line in the IO cell row 10A. Also, although illustration is omitted in FIG. 1, a plurality of external connection pads are placed in the semiconductor integrated circuit device 1. Note that the IO cell row 10A may be provided in part of the peripheral portion of the semiconductor integrated circuit device 1.

The IO cells 10 include signal IO cells and power IO cells. In the signal IO cells, included are circuits required to exchange signals with the outside of the semiconductor integrated circuit device 1 or with the core region 2, such as a level shifter circuit, an output buffer circuit, and a circuit for ESD protection. In the power IO cells, which supply power fed to the external connection pads to the inside of the semiconductor integrated circuit device 1, included is a circuit for ESD protection, for example.

Figure 2:
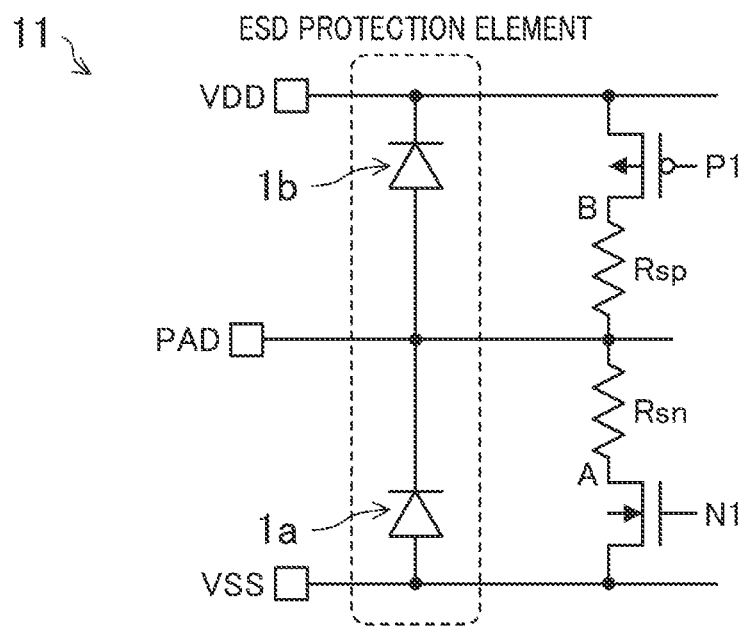
FIG. 2 is a circuit configuration diagram of an output circuit in the first embodiment.

FIG. 2 is a circuit configuration diagram of an output circuit 11 included in the IO cells 10. Note that, although an actual output circuit includes circuit elements other than those shown in FIG. 2, such elements are omitted in FIG. 2.

The output circuit 11 shown in FIG. 2 includes an external output terminal PAD, output transistors P1 and N1, electrostatic discharge (ESD) protection diodes 1a and 1b, and protective resistances Rsn and Rsp. The output transistor P1 is a p-type transistor and the output transistor N1 is an n-type transistor.

The output transistors P1 and N1 output signals to the external output terminal PAD according to signals received at their gates. The output transistor P1 is connected to VDD at its source and to the external output terminal PAD at its drain through the protective resistance Rsp. The output transistor N1 is connected to VSS at its source and to the external output terminal PAD at its drain through the protective resistance Rsn. In this embodiment, the protective resistances Rsp and Rsn are each constituted by a plurality of resistor elements formed in an interconnect layer that is formed in the back end of line (BEOL: interconnect process). Note that the node between the output transistor N1 and the protective resistance Rsn is herein called node A and the node between the output transistor P1 and the protective resistance Rsp is called node B.

The ESD protection diode 1a is provided between VSS and the external output terminal PAD, with its anode connected to VSS and its cathode connected to the external output terminal PAD. The ESD protection diode 1b is provided between VDD and the external output terminal PAD, with its anode connected to the external output terminal PAD and its cathode connected to VDD. If high-voltage noise is input into the external output terminal PAD, a current will flow to VDD and VSS through the ESD protection diodes 1a and 1b, thereby protecting the output transistors P1 and N1.

Figure 3:
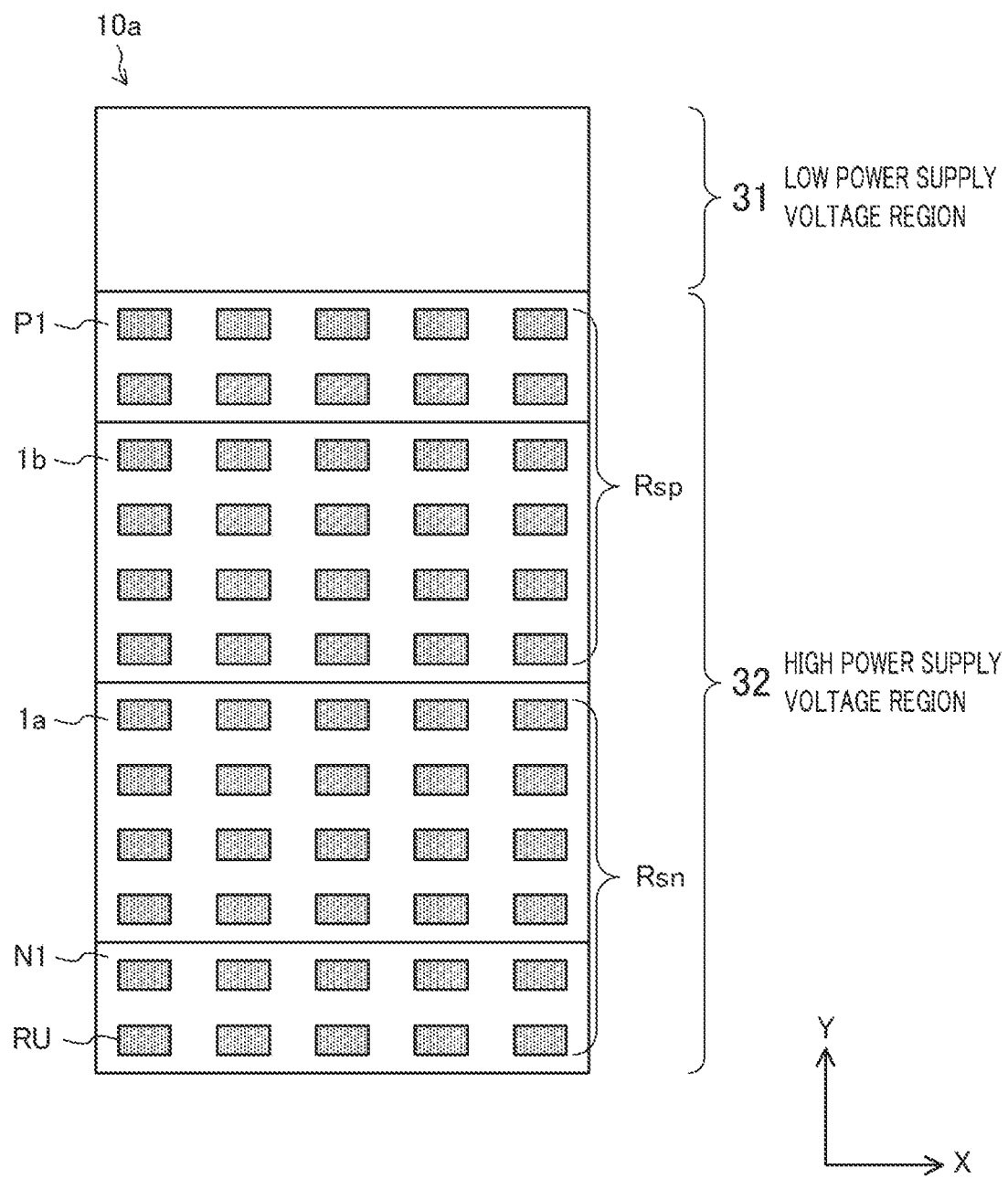
FIG. 3 shows an overview example of IO cell layout in the first embodiment.

FIG. 3 shows an overview example of IO cell layout in the first embodiment. The layout of FIG. 3 corresponds to an IO cell 10a, one of the IO cells 10 arranged along the lower edge of the semiconductor integrated circuit device 1 in FIG. 1. An IO cell generally includes: a high power supply voltage region including a circuit for ESD protection and an output buffer for outputting a signal to the outside of the semiconductor integrated circuit device; and a low power supply voltage region including a circuit for inputting/outputting a signal into/from the inside of the semiconductor integrated circuit device. The IO cell 10a of FIG. 3 has a low power supply voltage region 31 and a high power supply voltage region 32 separated in the Y direction. Note here that the X direction is the direction along an outer edge of the semiconductor integrated circuit device 1, and the Y direction is the direction perpendicular to the X direction. The low power supply voltage region 31 is located closer to the core region 2 and the high power supply voltage region 32 is located closer to the chip edge.

The IO cell 10a shown in FIG. 3 constitutes the output circuit 11 of FIG. 2. In the high power supply voltage region 32, formed are the output transistor N1, the ESD protection diode 1a, the ESD protection diode 1b, and the output transistor P1 in this order from the chip edge. Resistor elements RU are arranged in an array in the X and Y directions above the output transistors N1 and P1 and the ESD protection diodes 1a and 1b. The resistor elements RU placed above the output transistor N1 and the ESD protection diode 1a are mutually connected to constitute the protective resistance Rsn. The resistor elements RU placed above the output transistor P1 and the ESD protection diode 1b are mutually connected to constitute the protective resistance Rsp. The connecting style of the resistor elements RU may be serial connection, parallel connection, or a combination of serial connection and parallel connection.

Figure 9:
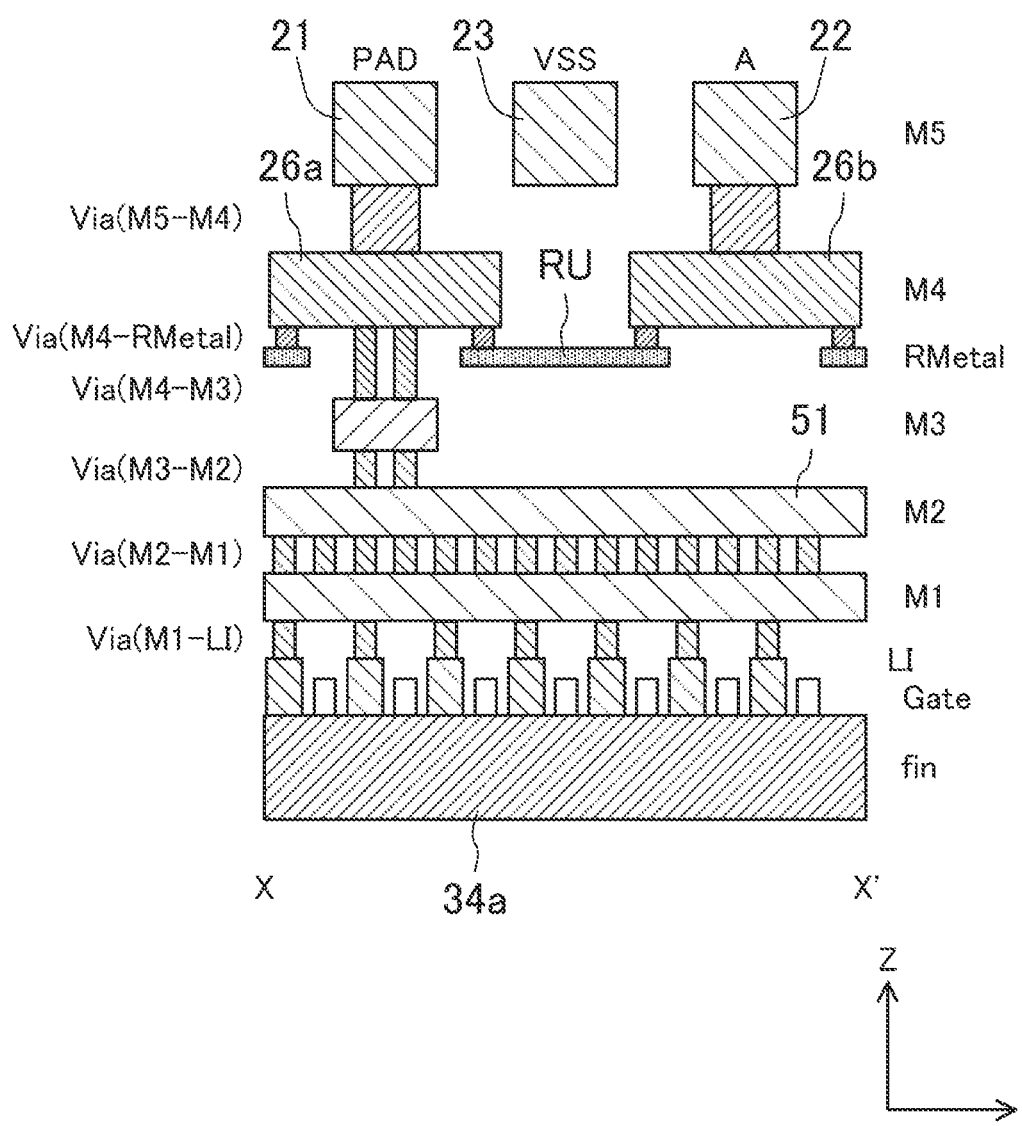
FIG. 9 is a cross-sectional view showing details of the IO cell layout of FIG. 3.

FIGS. 4 to 8 are plan views showing details of the layout of the IO cell, in which a portion of FIG. 3 including the ESD protection diode 1a and the output transistor N1 is enlarged and shown on a layer-by-layer basis. FIG. 9 is a cross-sectional view taken along line X-X' in FIG. 4.

Figure 4:
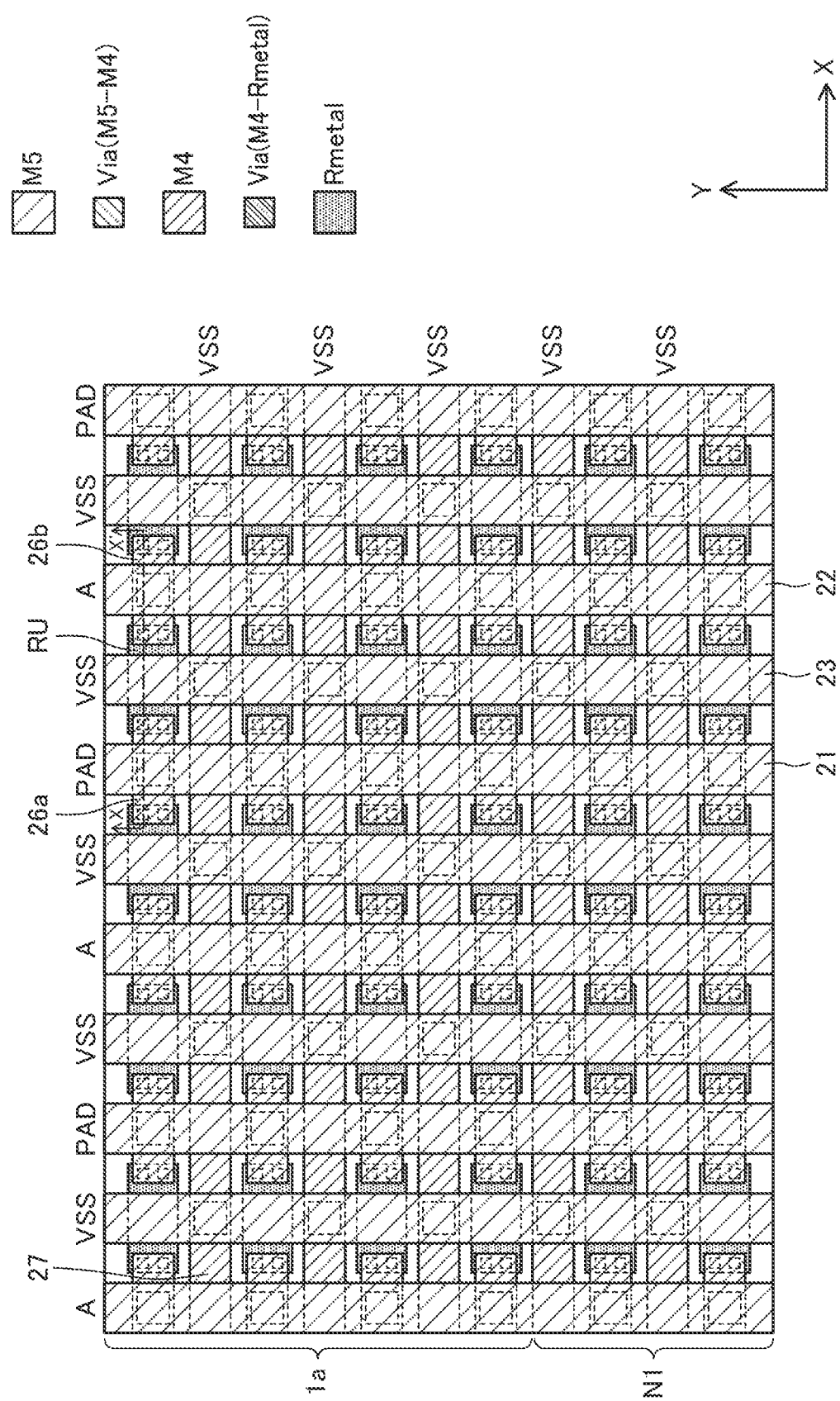
FIG. 4 is a plan view showing details of the IO cell layout of FIG. 3

FIG. 4 shows the structure of an M5 interconnect layer, an M4 interconnect layer, and an RMetal interconnect layer. The RMetal interconnect layer, formed between the M4 interconnect layer and an M3 interconnect layer, is a layer for forming the resistor elements RU. The RMetal interconnect layer is formed in the BEOL (interconnect process). The resistor elements RU formed in the RMetal interconnect layer are connected to interconnects in the M4 interconnect layer through vias.

In the M5 interconnect layer, M5 interconnects 21, 22, and 23 extending in the Y direction are formed. The M5 interconnects 21 correspond to the external output terminal PAD and are connected to an IO pad not shown. The M5 interconnects 22 correspond to the node A, and the M5 interconnects 23 are connected to VSS. In the M4 interconnect layer, M4 interconnects 26a, 26b, and 27 extending in the X direction are formed. The M4 interconnects 27 are connected to the M5 interconnects 23 through vias. That is, the M4 interconnects 27 are connected to VSS.

In the RMetal interconnect layer, the resistor elements RU are formed. Each of the resistor elements RU is connected to the M4 interconnects 26a and 26b at its ends in the X direction through vias. The M4 interconnects 26a are connected to the M5 interconnects 21 through vias, and the M4 interconnects 26b are connected to the M5 interconnects 22 through vias. That is, each of the resistor elements RU is connected between the external output terminal PAD and the node A through a route of M5 interconnect 21 (PAD)→via (M5-M4)→M4 interconnect 26a→via (M4-RMetal)→resistor element RU→via (M4-RMetal)→M4 interconnect 26b→via (M5-M4)→interconnect 22 (A). The protective resistance Rsn is constituted by a plurality of resistor elements RU.

Also, in the area where the ESD protection diode 1a is placed, the M4 interconnects 27 supplying VSS extend in the X direction along gaps between adjacent resistor elements RU in the Y direction. That is, the M4 interconnects 27 are not split by the presence of the resistor elements RU.

Figure 5:
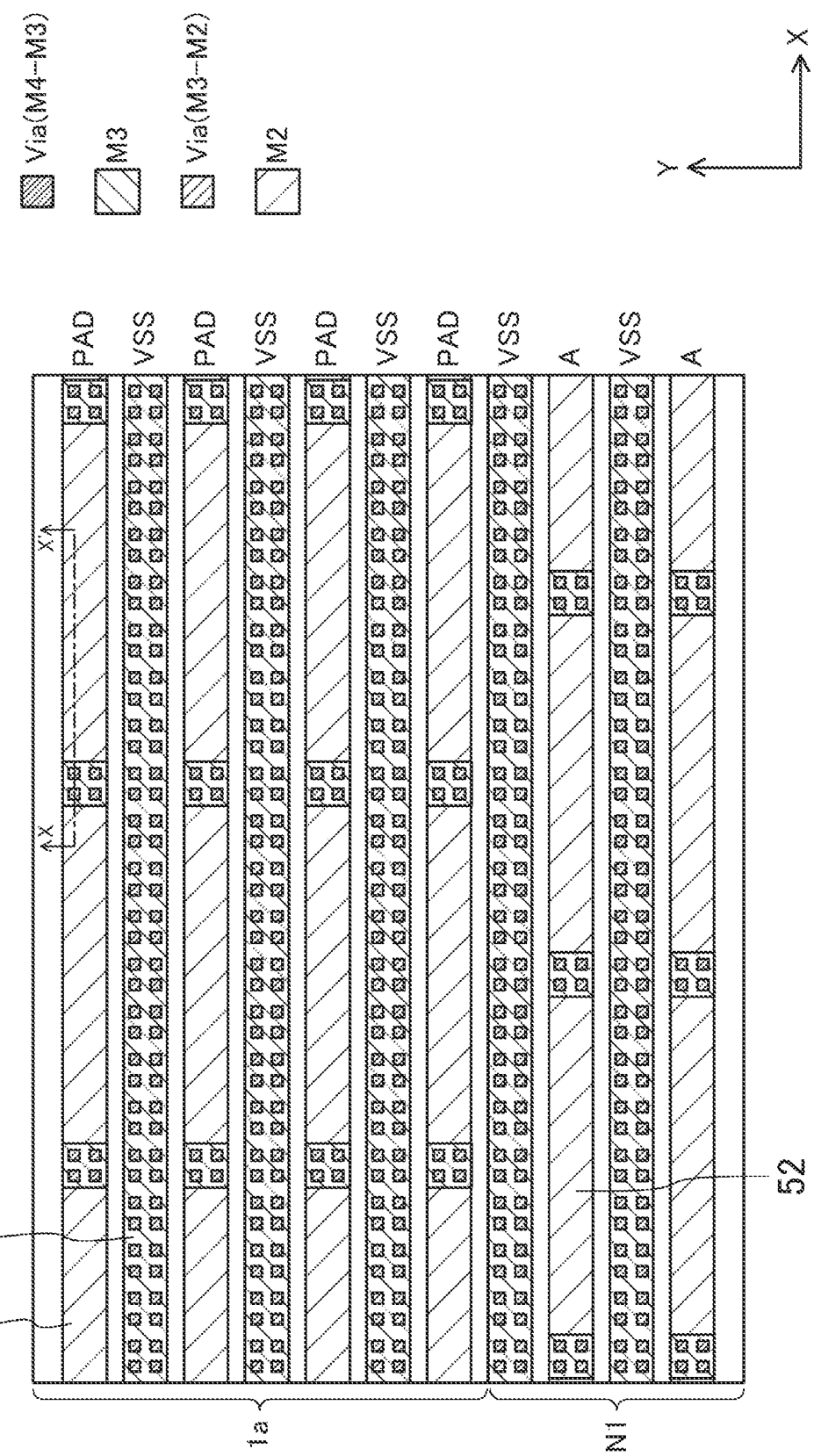
FIG. 5 is a plan view showing details of the IO cell layout of FIG. 3

FIG. 5 shows a portion below the layers in FIG. 4, illustrating the structure of the M3 interconnect layer and an M2 interconnect layer. In FIG. 5, M3 interconnects and M2 interconnects extend in the X direction. Vias (M4-M3) and vias (M3-M2) are formed at the same positions in planar view.

M2 interconnects 51 to be connected to the external output terminal PAD are connected to the M5 interconnects 21 through vias, M3 interconnects, and M4 interconnects. M2 interconnects 52 to be connected to the node A are connected to the M5 interconnects 22 through vias, M3 interconnects, and M4 interconnects. M2 interconnects 53 and M3 interconnects 54 to supply VSS are placed at the same positions in planar view, and connected to the M4 interconnects 27 through vias.

To the ESD protection diode 1a, the M2 interconnects 51 connected to PAD are connected through M1 interconnects not shown, which are formed at the same positions as the M2 interconnects 51 in planar view. Also, to the ESD protection diode 1a, the M2 interconnects 53 supplying VSS are connected through M1 interconnects not shown, which are formed at the same positions as the M2 interconnects 53 in planar view. To the output transistor N1, the M2 interconnects 52 connected to the node A are connected through a metal interconnect layer, vias, and the like not shown. Also, to the output transistor N1, the M2 interconnects 53 supplying VSS are connected through a metal interconnect layer, vias, and the like not shown.

Figure 6:
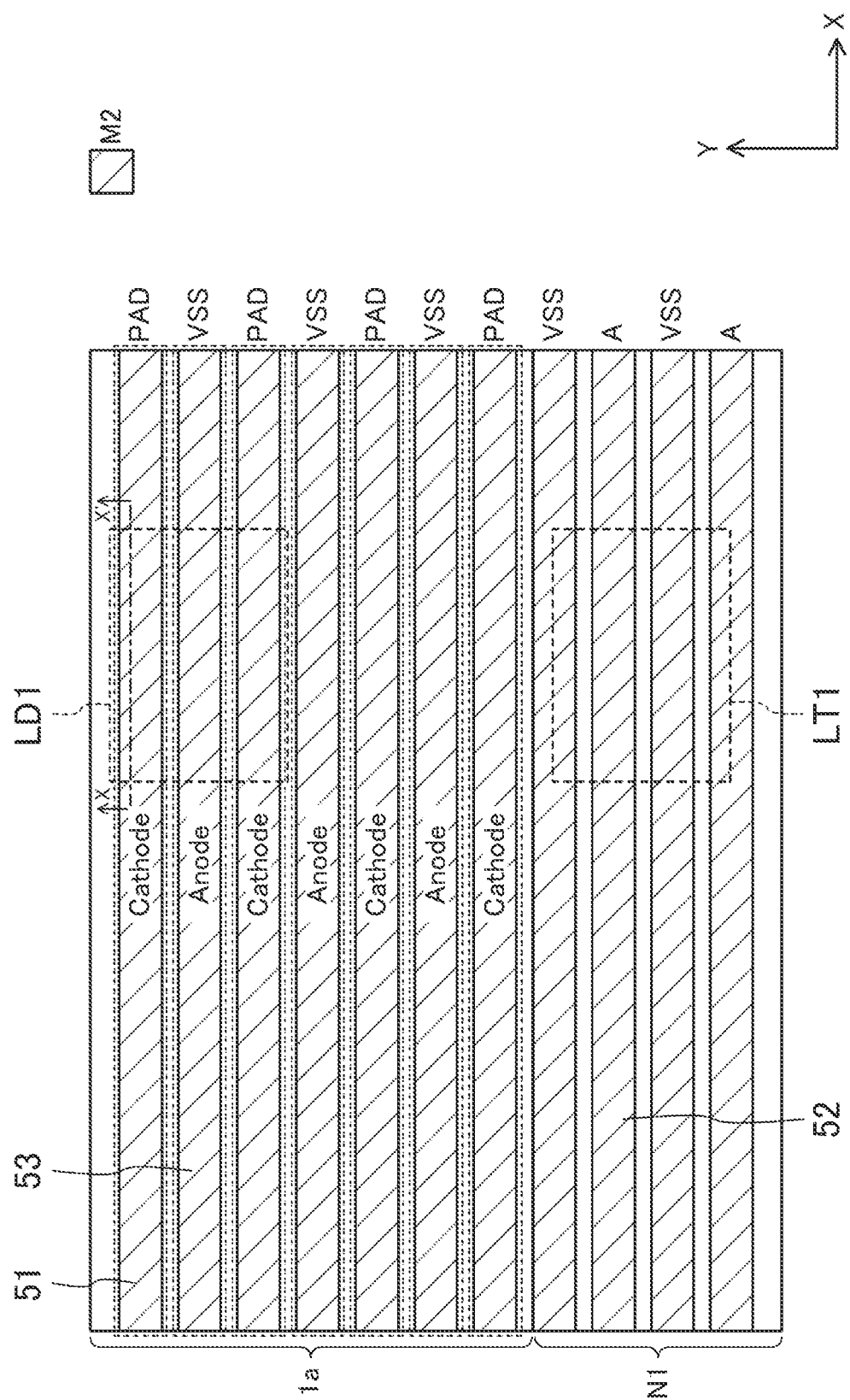
FIG. 6 is a plan view showing details of the IO cell layout of FIG. 3

FIG. 6 shows a portion below the layers in FIG. 5, illustrating the positional relationship between the M2 interconnect layer and the anodes/cathodes of the ESD protection diode 1a. As shown in FIG. 6, the ESD protection diode 1a has cathodes to be connected to the external output terminal PAD at positions overlapping the M2 interconnects 51 connected to the external output terminal PAD, and anodes to be connected to VSS at positions overlapping the M2 interconnects 53 supplying VSS. That is, the resistor elements RU and the cathodes of the ESD protection diode 1a are placed at positions overlapping each other in planar view.

To satisfy the positional relationship described above, it is preferable that the arrangement pitch of the cathodes of the ESD protection diode 1a, the arrangement pitch of the anodes of the ESD protection diode 1a, and the arrangement pitch of the resistor elements RU in the Y direction be equal to one another.

Figure 7:
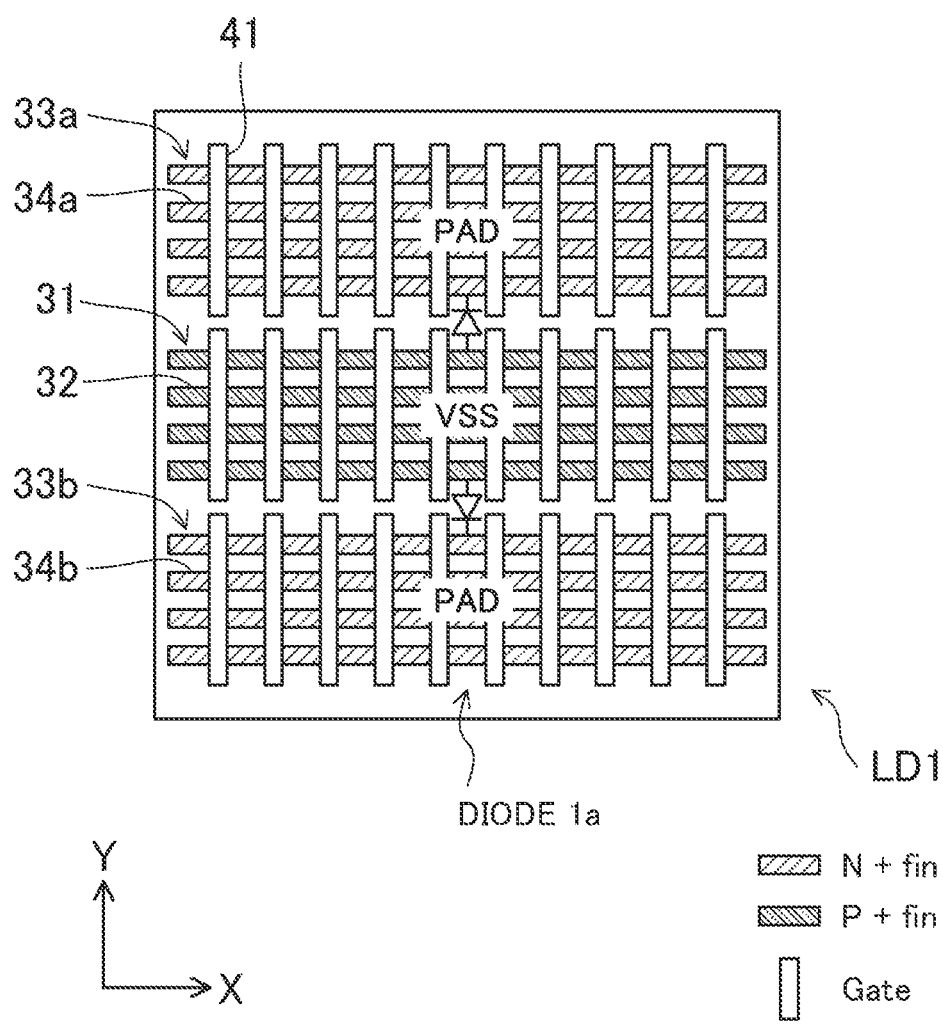
FIG. 7 is a plan view showing a layout of an ESD protection diode.

FIG. 7 shows a layout of area LD1 in FIG. 6, i.e., a layout of the ESD protection diode 1a. As shown in FIG. 7, the ESD protection diode 1a includes an anode part 31 formed of p-type fins 32 and cathode parts 33a and 33b formed of n-type fins 34a and 34b, respectively. The fins 32, 34a, and 34b extend in the X direction. The anode part 31 is connected to VSS, and the cathode parts 33a and 33b are connected to the external output terminal PAD. Diodes are formed between the p-type fins 32 and the n-type fins 34a and 34b.

FIG. 8 shows a layout of area LT1 in FIG. 6, i.e., a layout of the output transistor N1. As shown in FIG. 8, the output transistor N1 includes a plurality of n-type fins 61 extending in the X direction, arranged in order in the Y direction, and a plurality of gate interconnects 62 extending in the Y direction, arranged in order in the X direction. Overlaps between the fins 61 and the gate interconnects 62 in planar view form transistors. The transistors are mutually connected in parallel through interconnects not shown. The drains of the transistors are connected to the external output terminal PAD through the protective resistance Rsn.

Note that a portion of FIG. 3 including the ESD protection diode 1b and the output transistor P1 also has a layout similar to that described above. That is, it is only required to invert the layouts of FIGS. 4 to 6 vertically (in the Y direction), replace VSS with VDD, and replace the node A with the node B. In the case of the ESD protection diode 1b, the cathodes to be connected to VDD are placed at positions overlapping M2 interconnects supplying VDD, and the anodes are placed at positions overlapping M2 interconnects connected to the external output terminal PAD. That is, the anodes of the ESD protection diode 1b and the resistor elements RU are placed at positions overlapping each other in planar view. In the ESD protection diode 1b, also, the arrangement pitch of the cathodes and the arrangement pitch of the anodes are preferably equal to the arrangement pitch of the resistor elements RU in the Y direction.

Figure 10:
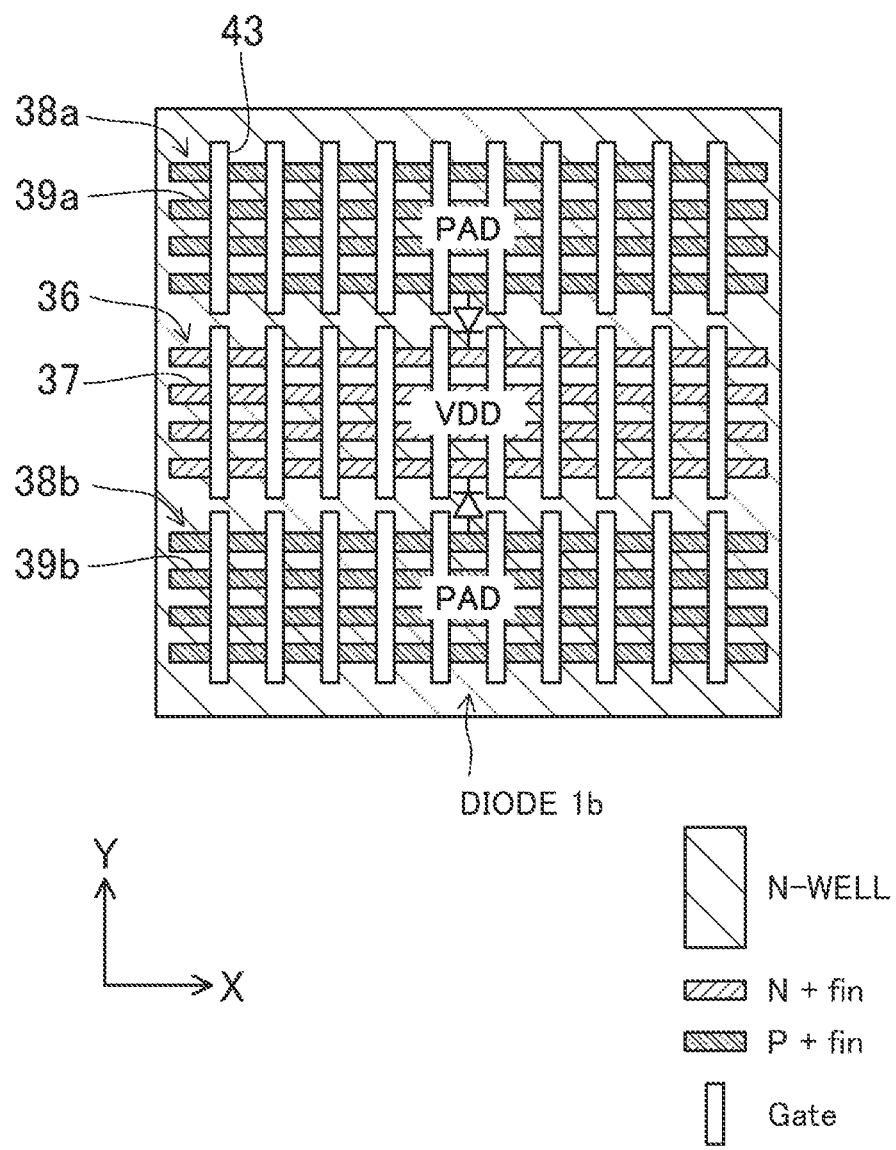
FIG. 10 is a plan view showing a layout of an ESD protection diode.

FIG. 10 shows a layout of the ESD protection diode 1b. The ESD protection diode 1b includes a cathode part 36 formed of n-type fins 37 and anode parts 38a and 38b formed of p-type fins 39a and 39b, respectively. The fins 37, 39a, and 39b extend in the X direction. The cathode part 36 is connected to VDD, and the anode parts 38a and 38b are connected to the external output terminal PAD. Diodes are formed between the n-type fins 37 and the p-type fins 39a and 39b.

Figure 11:
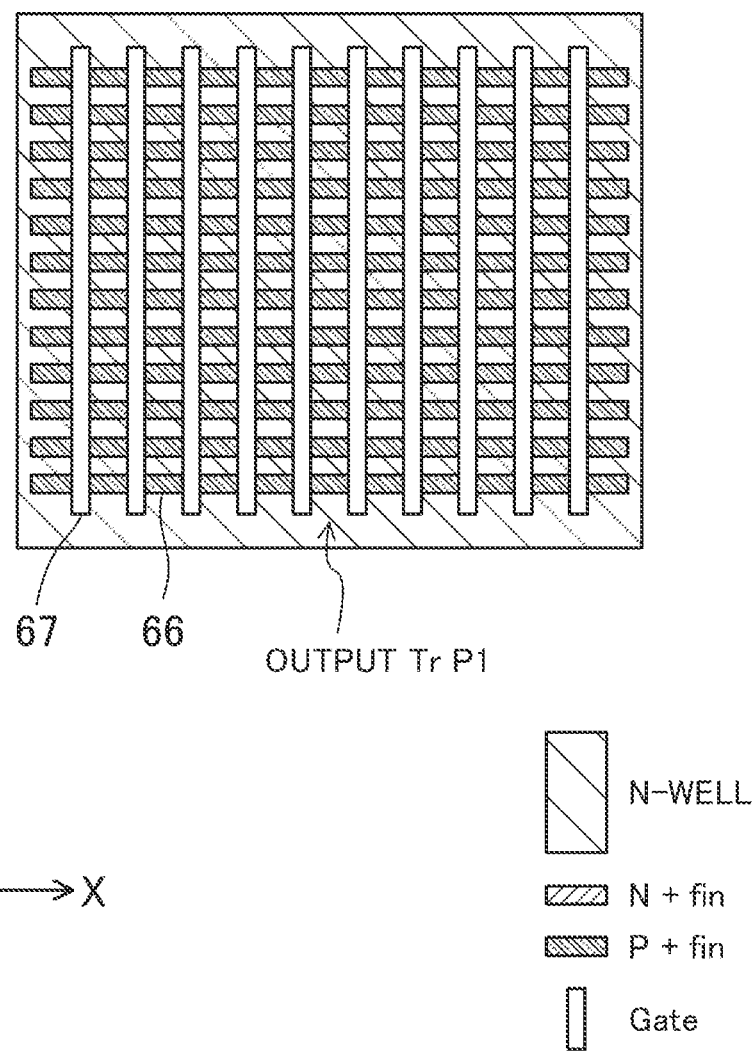
FIG. 11 is a plan view showing a layout of an output transistor.

FIG. 11 shows a layout of the output transistor P1. The output transistor P1 includes a plurality of p-type fins 66 extending in the X direction, arranged in order in the Y direction, and a plurality of gate interconnects 67 extending in the Y direction, arranged in order in the X direction. Overlaps between the fins 66 and the gate interconnects 67 in planar view form transistors. The transistors are mutually connected in parallel through interconnects not shown. The drains of the transistors are connected to the external output terminal PAD through the protective resistance Rsp.

According to this embodiment, the following advantages are obtained. In the configuration of this embodiment, the terminals, i.e., the anodes or cathodes of the ESD protection diodes 1a and 1b, whichever are connected to the power supply VSS or VDD (i.e., the anodes of the ESD protection diode 1a and the cathodes of the ESD protection diode 1b) are placed not to overlap the resistor elements RU. With this, the resistance in the routes from the power supplies VSS and VDD to the ESD protection diodes 1a and 1b can be reduced. This permits effective operation of the ESD protection diodes 1a and 1b, whereby the ESD tolerance can be improved.

Also, the arrangement pitch of the cathodes, and the arrangement pitch of the anodes, of the ESD protection diodes 1a and 1b, and the arrangement pitch of the resistor elements RU in the Y direction are made equal to one another. With this, the terminals of the ESD protection diodes 1a and 1b to be connected to a power supply can be placed to overlap upper-layer interconnects supplying power in planar view. Since this permits connection in the vertical downward direction from the upper-layer interconnects to the terminals of the ESD protection diodes 1a and 1b to be connected to a power supply, no interconnects extending in the Y direction are required. Therefore, the resistance in the routes from the power supplies to the ESD protection diodes 1a and 1b can be reduced.

Moreover, the terminals, i.e., the anodes or cathodes of the ESD protection diodes 1a and 1b, whichever are connected to the external output terminal PAD (i.e., the cathodes of the ESD protection diode 1a and the anodes of the ESD protection diode 1b) are placed to overlap interconnects connected to the external output terminal PAD (e.g., the M4 interconnects 26a). With this, the resistance in the routes from the external output terminal PAD to the ESD protection diodes 1a and 1b can be reduced. This permits effective operation of the ESD protection diodes 1a and 1b, whereby the ESD tolerance can be improved.

Second Embodiment

Figure 12:
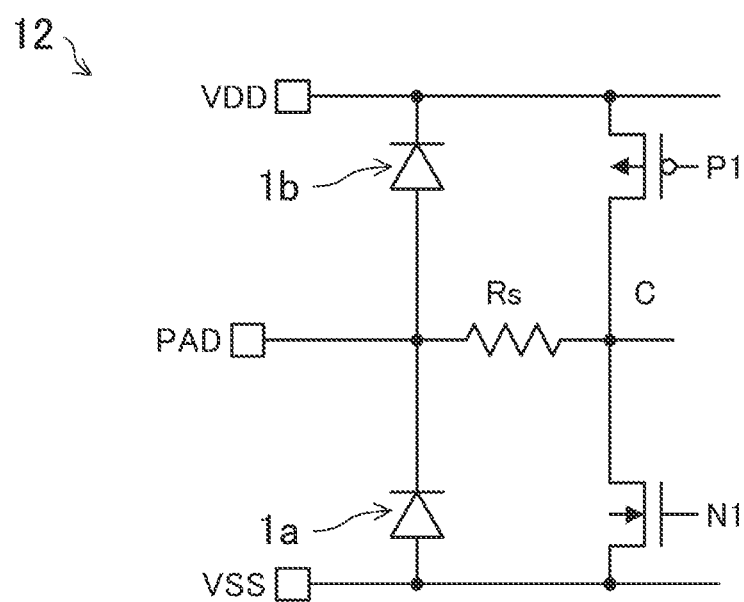
FIG. 12 is a circuit configuration diagram of an output circuit in the second embodiment.

FIG. 12 is a circuit configuration diagram of an output circuit 12 according to this embodiment. The circuit configuration of FIG. 12 is similar to that of FIG. 2 in the first embodiment, except for the position of insertion of a protective resistance. That is, in the output circuit 12 of FIG. 12, a protective resistance Rs is provided in place of the protective resistances Rsn and Rsp in FIG. 2. In FIG. 12, the drains of the output transistors P1 and N1 are mutually connected, and the protective resistance Rs is provided between the external output terminal PAD and the drains of the output transistors P1 and N1. Note that the node between the drains of the output transistors P1 and N1 and the protective resistance Rs is called node C.

Figure 13:
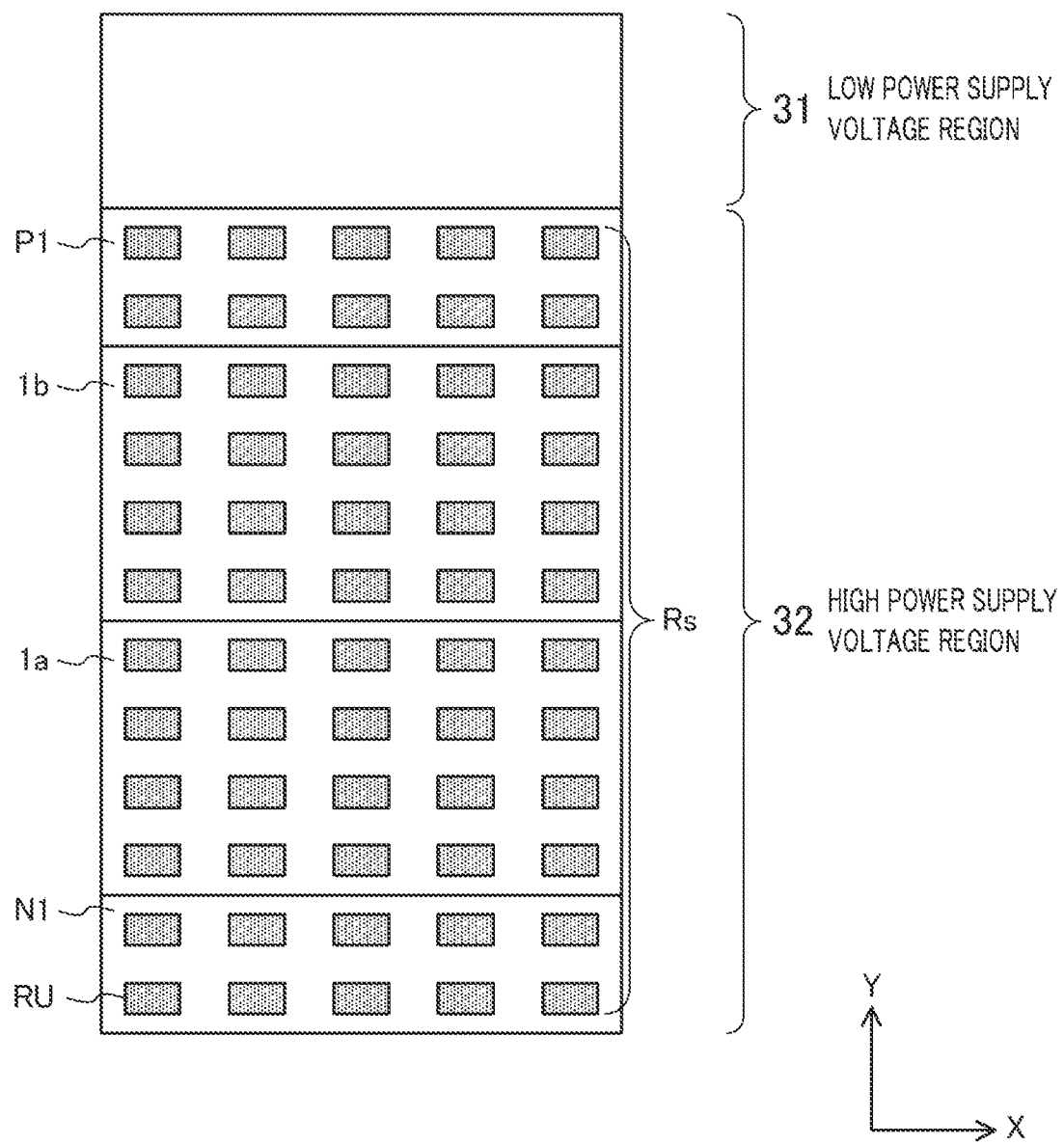
FIG. 13 shows an overview example of IO cell layout in the second embodiment.

FIG. 13 shows an overview example of IO cell layout, which is similar to the IO cell layout of FIG. 3 in the first embodiment. In this embodiment, however, the resistor elements RU placed above the output transistors N1 and P1 and the ESD protection diodes 1a and 1b are mutually connected to constitute the protective resistance Rs. The connecting style of the resistor elements RU may be serial connection, parallel connection, or a combination of serial connection and parallel connection.

Figure 14:
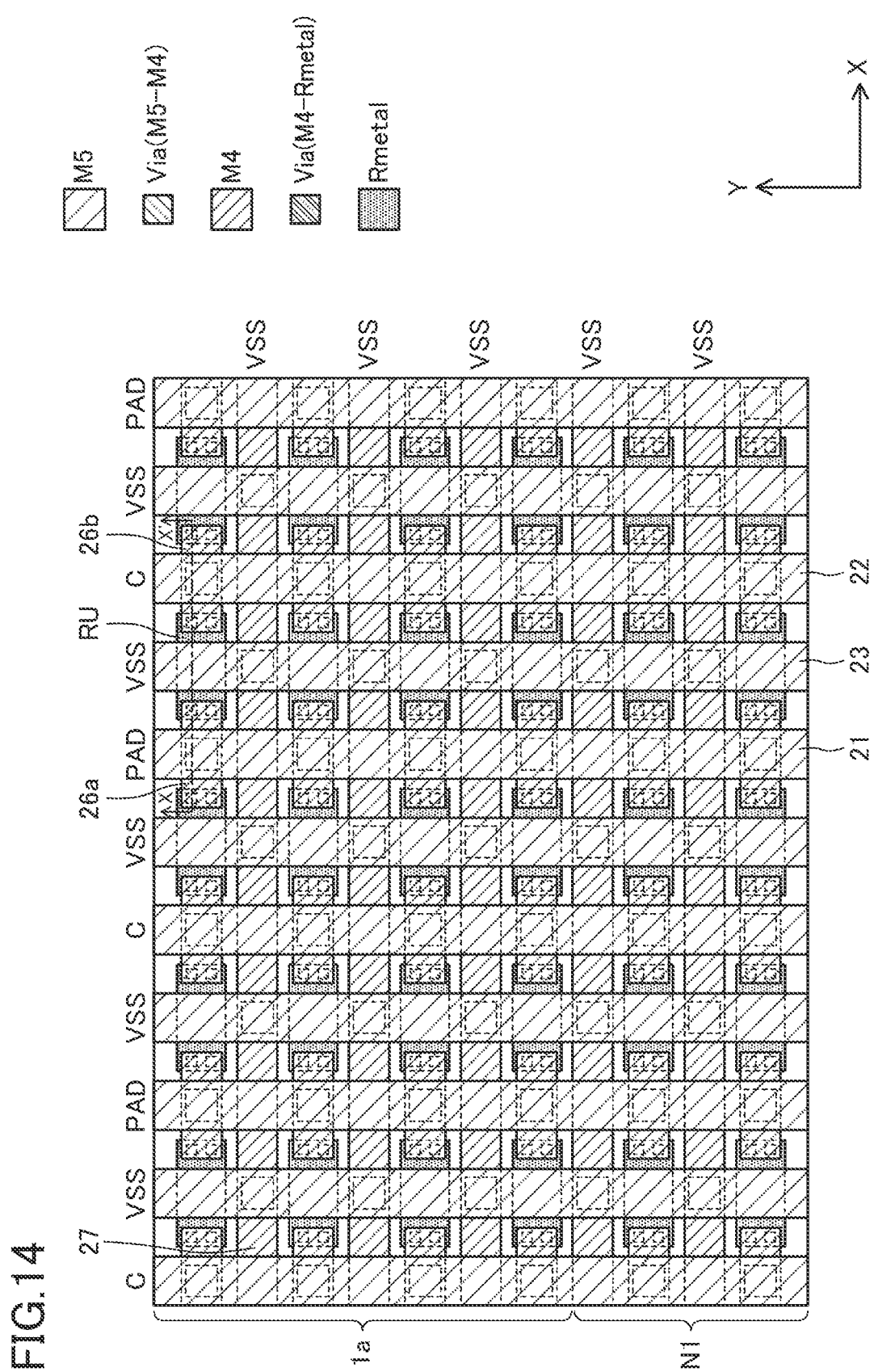
FIG. 14 is a plan view showing details of the IO cell layout of FIG. 13.

FIG. 14 is a plan view showing details of the layout of the IO cell, in which a portion of FIG. 13 including the ESD protection diode 1a and the output transistor N1 is enlarged. FIG. 14 shows the structure of the M5 interconnect layer, the M4 interconnect layer, and the RMetal interconnect layer. The configuration of layers below the layers in FIG. 14 and the cross-sectional structure in this embodiment are similar to those in the first embodiment, and therefore illustration thereof is omitted here.

The layout of FIG. 14 is similar to the layout of FIG. 4 in the first embodiment, except that the M5 interconnects 22 correspond to the node C, not the node A. Likewise, the layouts of layers below the layers in FIG. 14 are similar to those shown in the first embodiment, except that the interconnects and the like connected to the node A in the first embodiment are connected to the node C instead.

Also, a portion of FIG. 13 including the ESD protection diode 1b and the output transistor P1 is basically similar to that in the first embodiment, except that the interconnects and the like connected to the node B in the first embodiment are connected to the node C instead. The M5 interconnects 22 in FIG. 14 and the M5 interconnects in the portion including the ESD protection diode 1b and the output transistor P1 corresponding to the node C are mutually connected.

According to this embodiment, advantages similar to those in the first embodiment are obtained. That is, the terminals, i.e., the anodes or cathodes of the ESD protection diodes 1a and 1b, whichever are connected to the power supply VSS or VDD are placed not to overlap the resistor elements RU. With this, the resistance in the routes from the power supplies VSS and VDD to the ESD protection diodes 1a and 1b can be reduced. This permits effective operation of the ESD protection diodes 1a and 1b, whereby the ESD tolerance can be improved.

Also, the arrangement pitch of the anodes, and the arrangement pitch of the cathodes, of the ESD protection diodes 1a and 1b, and the arrangement pitch of the resistor elements RU in the Y direction are made equal to one another. With this, the terminals of the ESD protection diodes 1a and 1b to be connected to a power supply can be placed to overlap upper-layer interconnects supplying power in planar view. Since this permits connection in the vertical downward direction from the upper-layer interconnects to the terminals of the ESD protection diodes 1a and 1b to be connected to a power supply, no interconnects extending in the Y direction are required. Therefore, the resistance in the routes from the power supplies to the ESD protection diodes 1a and 1b can be reduced.

Moreover, the terminals, i.e., the anodes or cathodes of the ESD protection diodes 1a and 1b, whichever are connected to the external output terminal PAD (i.e., the cathodes of the ESD protection diode 1a and the anodes of the ESD protection diode 1b) are placed to overlap interconnects connected to the external output terminal PAD (e.g., the M4 interconnects 26a). With this, the resistance in the routes from the external output terminal PAD to the ESD protection diodes 1a and 1b can be reduced. This permits effective operation of the ESD protection diodes 1a and 1b, whereby the ESD tolerance can be improved.

ALTERATION

Figure 15:
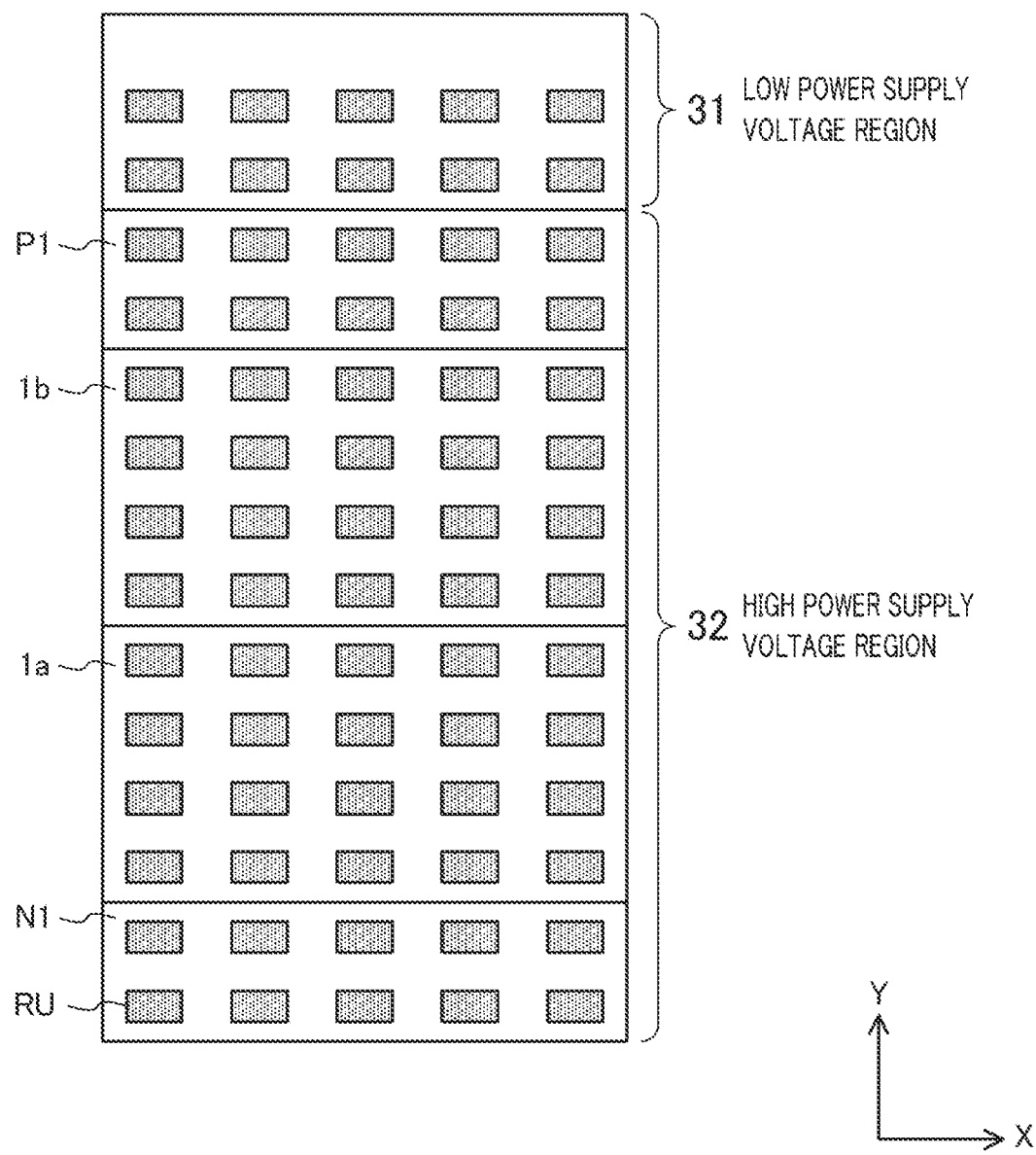
FIG. 15 shows an overview example of IO cell layout in an alteration.

FIG. 15 shows an overview example of IO cell layout in an alteration. As shown in FIG. 15, the resistor elements RU may also be arranged in the low power supply voltage region 31. With this, a protective resistance requiring a larger area can be formed.

Note that while the ESD protection diodes 1a and 1b and the output transistors N1 and P1 are constituted by fins in the above embodiments, the configuration is not limited to this.

While the p-type transistors and n-type transistors are all single-stage transistors in the output circuits of the above embodiments, the configuration is not limited to this. For example, they may be plural-stage transistors, such as two- or three-stage transistors, connected in series. Also, in the above embodiments, the output circuit can be an input/output circuit including an input circuit.

While the RMetal interconnect layer is formed between the M4 interconnect layer and the M3 interconnect layer in the above embodiments, the configuration is not limited to this. It is only required to form the RMetal interconnect layer in the BEOL.

According to the present disclosure, in a semiconductor integrated circuit device using resistor elements formed in the BEOL, the ESD tolerance can be improved. The present disclosure is therefore useful for improving the performance of system LSI, for example.

The invention claimed is:

1. A semiconductor integrated circuit device including an output circuit, the output circuit comprising:
   an external output terminal;
   a first electrostatic discharge (ESD) protection diode connected to the external output terminal at its first node and to a first power supply at its second node;
   a first protective resistance constituted by a plurality of resistor elements formed in a first interconnect layer, the first interconnect layer being formed in an interconnect process (back end of line (BEOL)), one of the ends of the first protective resistance being connected to the external output terminal; and
   a first output transistor connected between the other end of the first protective resistance and the first power supply,
   wherein
   first, second, and third interconnects extending in a first direction are formed in a second interconnect layer, the first and second interconnects are placed on opposite sides of each of the resistor elements in the first direction in planar view and connected to the resistor element, the first interconnect is connected to the external output terminal, and the third interconnect is connected to the first power supply,
   in the first ESD protection diode, the first and second nodes are formed alternately in a second direction perpendicular to the first direction, and
   the resistor elements and the first and second interconnects overlap the first node of the first ESD protection diode, and the third interconnect overlaps the second node of the first ESD protection diode, in planar view.

2. The semiconductor integrated circuit device of claim 1, wherein
   the arrangement pitch of the first node of the first ESD protection diode, the arrangement pitch of the second node of the first ESD protection diode, and the arrangement pitch of the resistor elements in the second direction are equal to one another.

3. The semiconductor integrated circuit device of claim 1, wherein
   the plurality of resistor elements are arranged in an array in the first and second directions in the first interconnect layer.

4. The semiconductor integrated circuit device of claim 1, wherein
   the output circuit further comprises:
   a second ESD protection diode connected to a second power supply at its first node and to the external output terminal at its second node;
   a second protective resistance constituted by a plurality of resistor elements formed in the first interconnect layer, one of the ends of the second protective resistance being connected to the external output terminal; and
   a second output transistor connected between the other end of the second protective resistance and the second power supply.

5. The semiconductor integrated circuit device of claim 1, wherein
   the output circuit further comprises:
   a second ESD protection diode connected to a second power supply at its first node and to the external output terminal at its second node; and
   a second output transistor connected between the other end of the first protective resistance and the second power supply.

* * * * *